United States Patent
Wei et al.

(10) Patent No.: US 9,103,022 B2
(45) Date of Patent: Aug. 11, 2015

(54) AMORPHOUS ALUMINUM ALLOY COATINGS

(75) Inventors: Ronghua Wei, San Antonio, TX (US); Marta Jakab, Boerne, TX (US); Craig Engel, Boerne, TX (US)

(73) Assignee: SOUTHWEST RESEARCH INSTITUTE, San Antonio, TX (US)

( * ) Notice: Subject to any disclaimer, the term of this patent is extended or adjusted under 35 U.S.C. 154(b) by 1524 days.

(21) Appl. No.: 11/865,160

(22) Filed: Oct. 1, 2007

(65) Prior Publication Data

US 2009/0087677 A1    Apr. 2, 2009

(51) Int. Cl.
| | |
|---|---|
| *C23C 14/35* | (2006.01) |
| *C23C 14/34* | (2006.01) |
| *C22C 45/08* | (2006.01) |
| *C23C 14/14* | (2006.01) |

(52) U.S. Cl.
CPC ............ *C23C 14/3414* (2013.01); *C22C 45/08* (2013.01); *C23C 14/14* (2013.01); *C23C 14/35* (2013.01); *Y10T 428/12* (2015.01)

(58) Field of Classification Search
CPC ........ B32B 15/01; C22C 45/08; C23C 14/14; C23C 14/3414; C23C 14/35; Y10T 428/12
USPC .................. 204/192.12, 192.15, 192.16
See application file for complete search history.

(56) References Cited

U.S. PATENT DOCUMENTS

| | | | | |
|---|---|---|---|---|
| 4,231,816 A | * | 11/1980 | Cuomo et al. ................ | 428/416 |
| 4,829,655 A | | 5/1989 | Cornelison et al. | |
| 4,966,669 A | * | 10/1990 | Sadamori et al. ........ | 204/192.12 |
| 5,030,300 A | * | 7/1991 | Hashimoto et al. ........... | 148/403 |
| 5,074,935 A | * | 12/1991 | Masumoto et al. ........... | 148/403 |
| 5,076,865 A | * | 12/1991 | Hashimoto et al. ........... | 148/403 |
| 5,108,846 A | * | 4/1992 | Steininger .................. | 428/824.2 |
| 5,143,557 A | | 9/1992 | Pierantoni et al. | |
| 5,366,564 A | * | 11/1994 | Yamagata et al. ............ | 148/403 |
| 5,407,548 A | * | 4/1995 | Kopacz et al. ........... | 204/192.15 |
| 2006/0231393 A1 | | 10/2006 | Mullapudi et al. | |
| 2007/0020528 A1 | | 1/2007 | Obrovac et al. | |
| 2007/0089986 A1 | | 4/2007 | Richert et al. | |
| 2007/0119701 A1 | | 5/2007 | Chistyakov | |

OTHER PUBLICATIONS

Mansour et al. "Atomic structure of amorphous Al100-2XCoXCeX (X=8,9, and 10) and Al80Fe10Ce10 alloys: An XAFS study", vol. 50, No. 17, Physical Review B, Nov. 1994 pp. 12 401-12 412.*

R. Bacewicz, "XAFS study of amorphous Al-RE alloys", Scripta Materialia 54 (2006—available online Dec. 2005) 1187-1191.*

ASTM International, Designation G 61 - 86 (Reapproved 2003), "Standard Test Method for Conducting Cyclic Potentiodynamic Polarization Measurements for Localized Corrosion Susceptibility of Iron-, Nickel-, or Cobalt- Based Alloys," pp. 1-5.

ASTM International, Designation G 5 - 94 (Reapproved 2004), "Standard Reference Test method for Making Potentiostatic and Potentiodynamic Anodic Polarization Measurements," pp. 1-11.

(Continued)

*Primary Examiner* — Rodney McDonald
(74) *Attorney, Agent, or Firm* — Grossman, Tucker et al

(57) ABSTRACT

The present disclosure relates to an amorphous aluminum alloy coating. The aluminum alloy coating may specifically include one of cerium, cobalt and/or molybdenum as alloying elements and be applied by a physical vapor deposition process to a desired thickness. The coating may supply improved corrosion resistance to a given environmental condition.

9 Claims, 8 Drawing Sheets

(56) References Cited

OTHER PUBLICATIONS

Goldman, et al., "Selected Corrosion Properties of a Novel Amorphous Al-Co-Ce Alloy System," Electrochemical and solid-State Letters, 8(2): p. 1-6, 2005.

Presuel-Moreno, et al., "Electrochemical Sacrificial Cathodic Protection Provided by an Al-Co-Ce metal Coating coupled to AA2024-T3," Journal of the Electrochemical Society, 152(8): p. B302-B310, 2005.

Jakab, et al., On-Demand Release of Corrosion-Inhibiting Ions from Amorphous Al-Co-Ce Alloys, Nature Materials, 4 (9): p. 667-670, 2005.

Jakab, et al., "Critical Concentrations Associated with Cobalt, Cerium and Molybdenum Inhibition of AA2024-T3 Corrosion: Delivery from Al-Co-Ce(-Mo)," Corrosion, 61(3): p. 246-263, 2005.

Scully, et al., "Corrosion of Amorphous Metals," in ASM Metals Handbook, ASM, Metals Park, OH, 2005.

He, et al., "On the Structural Nature of Aluminum-based Metallic Glasses," Philosophical Magazine Letters, 61(5): p. 297-303, 1990.

\* cited by examiner

AMORPHOUS ALUMINUM ALLOY COATINGS

GOVERNMENT RIGHTS CLAUSE

This invention was made with government support under government prime contract number FA9550-06-C-0112 awarded by the U.S. Air Force. The government has certain rights in this invention.

FIELD

The present disclosure relates to the development of an amorphous aluminum alloy coating which may provide corrosion resistance on a component exposed to air or moisture. The amorphous aluminum alloy coatings may contain Ce, Co and/or Mo as alloying elements.

BACKGROUND

Corrosion may be understood as the deterioration or degradation of a material upon exposure to a given environment or elements within the environment, such as water or oxygen. A common example of corrosion is the formation of rust due to the oxidation of iron. Corrosion may negatively affect desirable properties in the material, such as causing discoloration or weakening the material. To prevent corrosion, various treatments may be utilized, including passivation, anodization and/or surface treatments, including reactive and applied coatings. These various treatment methods and the individual coating compositional characteristics may aid in forming a barrier layer between the substrate and the environment, reducing and/or preventing corrosion.

SUMMARY

In a first exemplary aspect, the present disclosure relates to a method of forming an amorphous aluminum alloy by providing a vacuum chamber, a substrate for coating and a target material comprising aluminum and one or more alloying elements. This may then be followed by ejecting particles from the target and depositing an amorphous aluminum alloy coating wherein at least 50% of the alloy is amorphous.

In another exemplary embodiment the present disclosure again relates to a method of forming an amorphous aluminum alloy coating by providing a vacuum chamber, a substrate for coating and a target material comprising aluminum and one of Ce, Co and/or Mo as alloying elements, wherein aluminum is present at 50 to 88 atomic percent. This may then be followed by ejecting particles from the target and depositing an amorphous aluminum alloy coating wherein at least 50% of the alloy is amorphous and the coating has a thickness of 0.1-500 μm and wherein the coating indicates a ΔEpassive of greater than 0.250 Vsce.

In yet another exemplary embodiment the present disclosure relates to a coating comprising an amorphous alloy. The alloy may be at least 50% amorphous and contain aluminum and at least one of Ce, Co and/or Mo as alloying elements. The aluminum may be present at greater than or equal to 50 atomic percent and the coating may have a thickness of 0.1-500 μm.

BRIEF DESCRIPTION OF DRAWINGS

The above-mentioned and other features and advantages of this disclosure, and the manner of attaining them, may become more apparent and the disclosure may be better understood by reference to the following description of embodiments of the disclosure taken in conjunction with the accompanying drawings, wherein.

DETAILED DESCRIPTION

Figure 1:
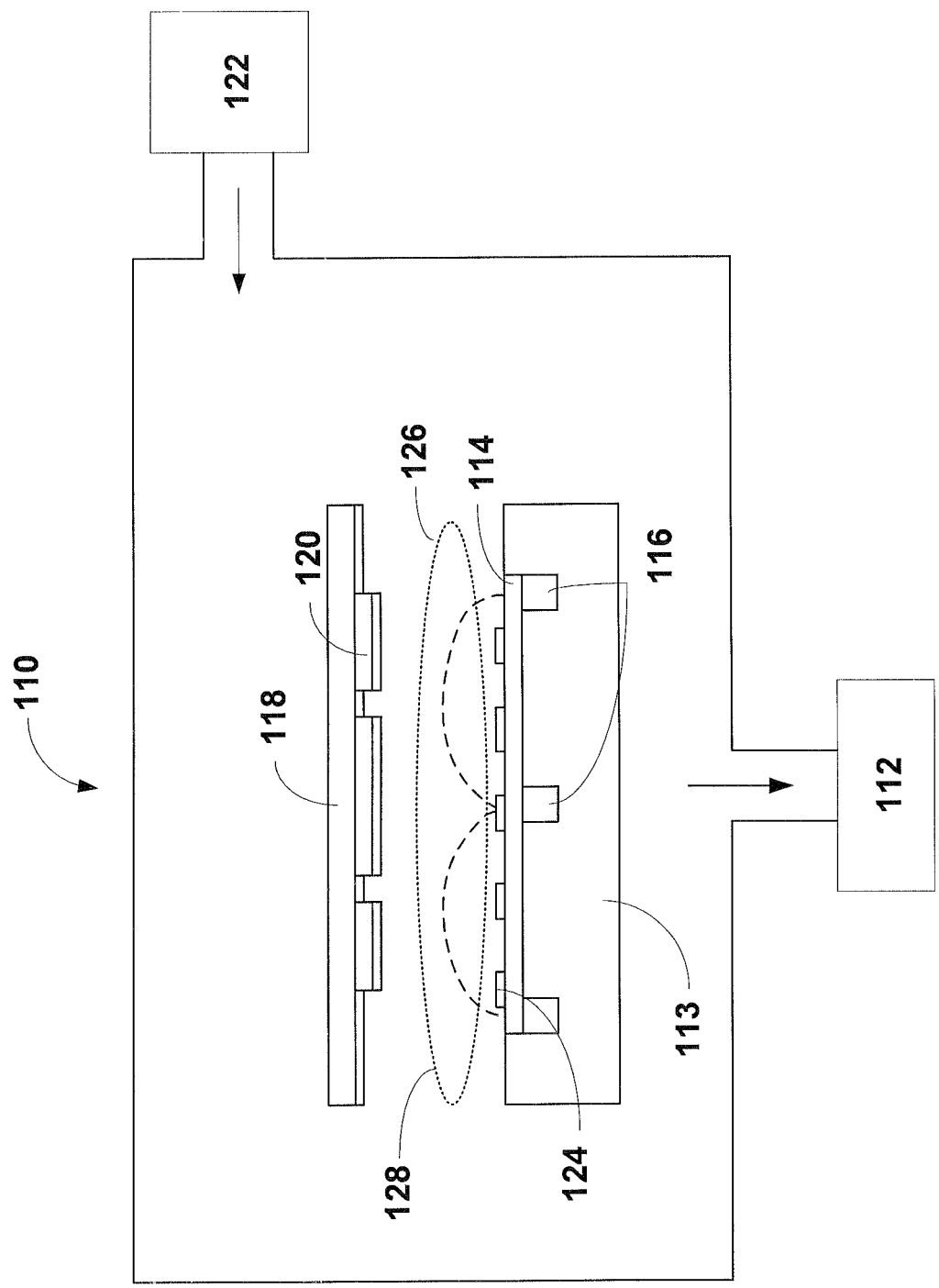
FIG. 1 is a schematic diagram of an example of a sputter deposition chamber including samples mounted on a sample holder and a magnetron including a target.

The present disclosure relates to an amorphous aluminum (Al) based composition that may include cerium (Ce), cobalt (Co) and/or molybdenum (Mo) as alloying elements. The coating may be formed by physical vapor deposition. The amorphous coating compositions provided herein may improve the corrosion resistance of a given substrate prone to oxidation or hydrolysis as compared to the corrosion resistance of the bare substance or coatings of principally crystalline morphology. Amorphous coatings may be understood herein as coatings that may be at least 50% amorphous, wherein the amorphous portions of the coating contains relatively little to no crystalline domains. Stated another way, microstructural nanocrystalline associations may exist in the amorphous portion of the material herein (e.g. having a size of about 100 nanometers or less). In addition, such nanocrystalline associations may be further characterized as associations that do not necessarily exhibit crystalline periodicity or periodic repetition of their structural associations in a given dimension. Accordingly, the amorphous coatings herein may be 50-100% amorphous, including all values and increments therein.

The coatings contemplated herein may include a number of amorphous aluminum alloys including Ce, Co and/or Mo. Such compositions include aluminum alloys, wherein the Al is present in an amount that provides for amorphous microstructure. The aluminum may therefore be present in an amount of about 50 atomic percent or greater. For example, the aluminum may be present between 50 to 88 atomic percent. Ce may be present at about 0 atomic percent to 30 atomic percent, including all values and increments therein. Co may be present at about 0 atomic percent to 30 atomic percent, including all values and increments therein. Mo may be present at about 0 atomic percent to 30 atomic percent including all values and increments therein.

In another exemplary embodiment, aluminum may again be present in the alloy compositions at levels of 50 atomic percent to about 88 atomic percent, including all values and ranges therein, such as in the range of 75 atomic percent to 85 atomic percent. The alloys may also include Ce, present in the range of 5 to 15%, including all values and increments therein, Co, present in the range of 5 to 15%, including all values and increments therein and/or Mo, present in the range of 5 to 15%, including all values and increments therein. It should be appreciated, however, that some impurities may exist within the alloy compositions. The impurities may be present in the range of about 0.01 to 5.0 atomic percent.

The substrates for coating may include any material subject to oxidation and/or hydrolysis, such as various steel alloys or aluminum alloys. In an exemplary embodiment, the substrate may include an aluminum alloy, wherein the aluminum may be present at levels of greater than 75 atomic %, including all values and increments in the range of 75 atomic percent to 99 atomic percent. The substrate alloys may also include one or more of the following elements Cu, Cr, Fe, Mg, Mn, Si, Ti, or Zn present at levels of about 25 atomic percent or less, including all values and increments in the range of 1 atomic percent to 25 atomic percent. Other alloying elements may be present in the substrate for coating at levels of less than about 1 atomic percent by weight. The substrate materials contemplated herein may have a density in the range of about 2.75 to 3.0 grams/cubic centimeter (g/cc) and may also have a coefficient of thermal expansion (CTE) in the range of about 24 µm/m-° C. to about 30 µm/m-° C., including all values and increments therein.

The amorphous aluminum coatings herein may be produced using a number of physical vapor deposition processes, such as cathodic arc deposition, evaporative deposition, electron beam physical vapor deposition, pulsed laser deposition and sputter deposition, including magnetron sputter deposition. Sputtering may be understood as the ejection of a material from a solid or liquid surface following the impact of energetic ions, atoms or molecules.

Figure 1A:
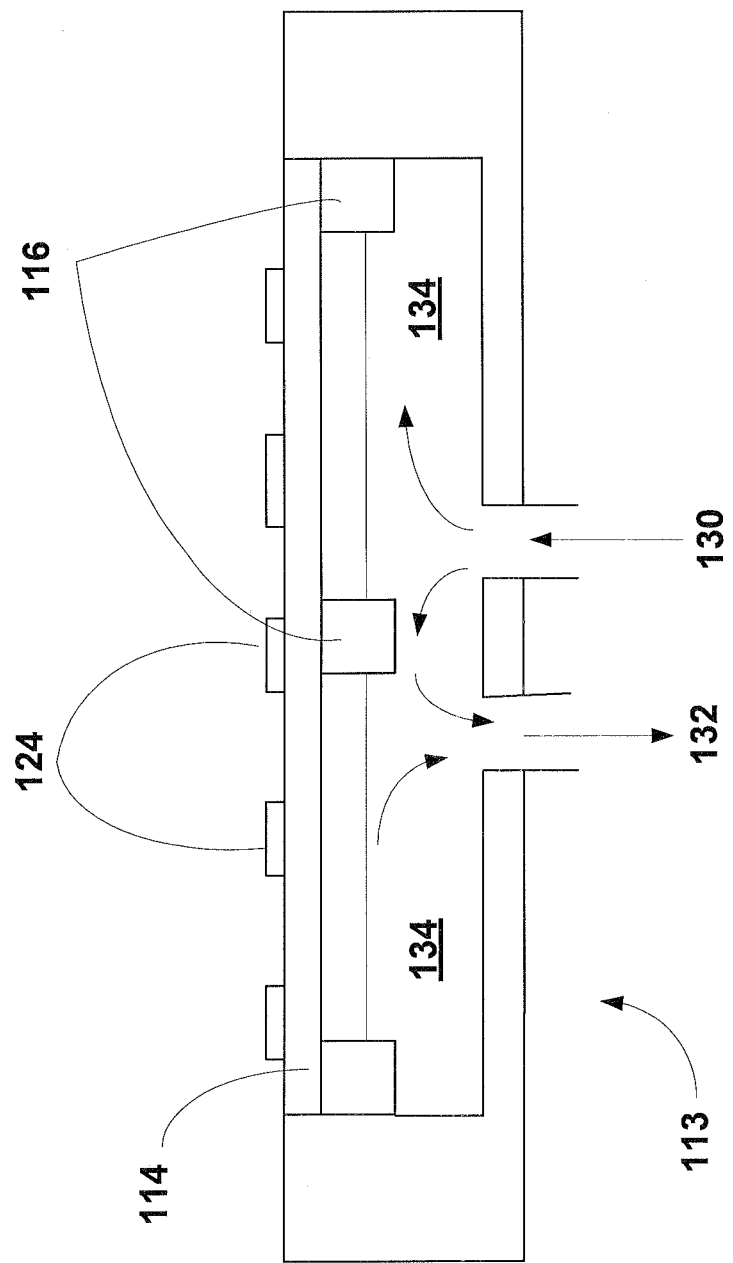
FIG. 1a is a schematic diagram of an example of a magnetron including a cooling system.

An exemplary magnetron sputtering system is illustrated in FIG. 1. The system may include a vacuum process chamber 110 and one or more vacuum pumps 112 (not illustrated) in communication with the vacuum chamber. Within the process chamber 110 may be located a magnetron 113 including at least one target 114 that may be formed from the alloy to provide the coating, one or more magnets 116 positioned behind the target and a sample holder 118 for retaining a number of substrates 120. Furthermore, a gas supply 122 may communicate with the process chamber. Optionally, a cooling system for cooling the target (illustrated in FIG. 1a) may be provided which may prevent demagnetization and/or heat damage of the target. The cooling system may include an inlet 130, and outlet 132 and at least one cooling channel or baffle 134. Cooling water, oil or gas may be circulated through the cooling system.

The sputtering targets may be selected and prepared by a number of methods to provide an alloy composition. In an exemplary embodiment, the target may be provided by alloying Al with Ce, Co and/or Mo by processes such as casting or powder metallurgy. In another embodiment, an aluminum target may be provided and the alloying elements, Ce, Co and/or Mo may be tiled on top of the target, as illustrated in FIG. 1, wherein tiles 124 are placed on top of the target 114. Tiles may therefore be understood as a sample of metal material positioned with the aluminum target which may therefore become one of the metals in the coating. Accordingly, there may be one or a plurality of such metal tiles present as a sputtering target and the tiles may include a metal other than aluminum.

In a further embodiment, the target may include a matrix of aluminum and discrete domains of a metal other than aluminum. Such domains may therefore be provided by drilling into the aluminum target and impregnating the alloying elements, such as Ce, Co and/or Mo into the drilled portions of the target. In addition, it is contemplated that multiple magnetrons may be utilized for each element of the composition.

In addition, the targets contemplated herein may be of a variety of geometric shapes, e.g., rectangular or cylindrical targets.

Figure 2:
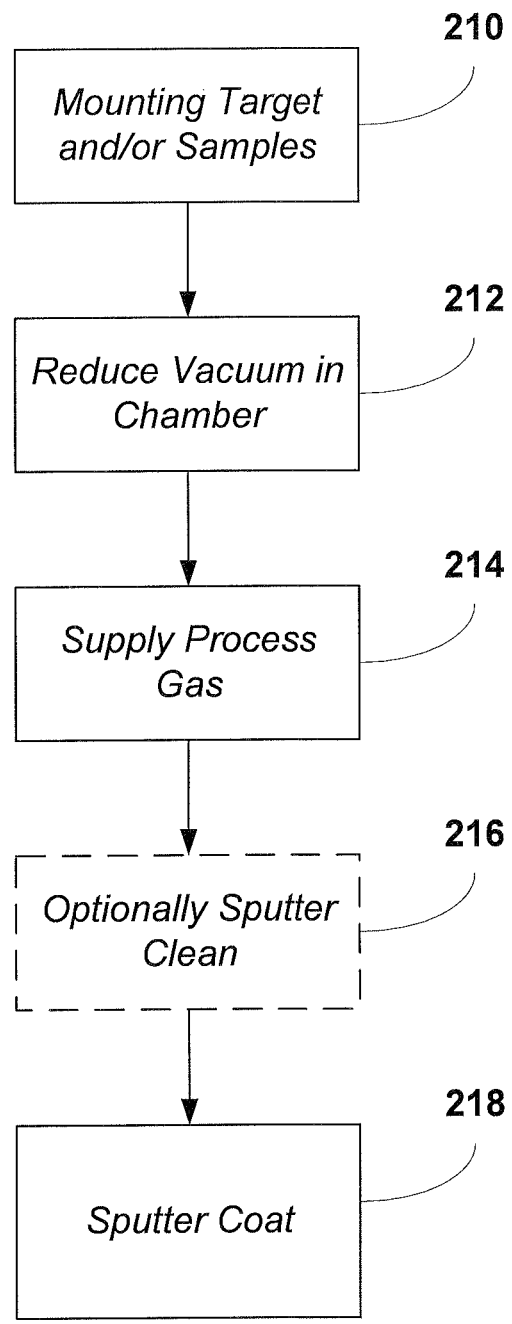
FIG. 2 is an exemplary flow diagram of a sputtering process, including the optional step of sputter cleaning prior to the step of coating.

FIG. 2 illustrates an exemplary methodology for producing an amorphous aluminum alloy coating by magnetron sputtering. Sputtering may be accomplished by selecting an appropriate target, mounting the target or targets within the magnetron and mounting the substrates to the substrate holder at 210. Vacuum pressure may then be applied at 212 to the vacuum process chamber reducing the pressure in the chamber to approximately $10^{-3}$ to $10^{-7}$ Torr, including all values and increments therein. Process gas, typically an inert gas, such as Ar, may be supplied to the vacuum chamber until a pressure of a few millitorr may be reached at 214.

In addition, prior to applying the coating, the gas may be ionized and the substrates may be sputtered (or bombarded) by the gas ions to clean the substrates at 216. This may require that an ionization source for the gas, such as an RF source, electron beam source, etc., be incorporated into the system. In addition, the substrates may be biased with a negative voltage of 1 to 1,500 V including all values and increments therein. The substrate may be cleaned for a few minutes to a couple of hours, including all values and increments in the range of 3 minutes to 10 hours.

To apply the coating at 218, gas plasma 126 may be generated by applying a voltage to the target in the range of about a few hundred volts, such as a range of about −100 to −500 V, including all values and increments therein, or a power of 1 to 10 kW, including all values and increments therein. The negative voltage may draw ions from the plasma (i.e. ionized gas) towards the target causing the ions to bombard the target at a sufficient energy to eject atoms of the target composition towards the substrate. In addition, a magnetic field, represented by exemplary primary magnetic field 128, may be formed by the magnets 116. The field may trap a portion of the secondary electrons emitted form the target, which may increase ionizing collisions of secondary electrons with neutral gas around the target. A bias voltage in the range of about 0 to 1,500 Volts, including all values and increments therein, may be applied to the substrates or sample holder and a portion of the atoms ejected from the target may be deposited on the substrate and form a coating thereon. The substrates may be sputtered for a few minutes to a few hours, including all values and increments in the range of 5 minutes to 10 hours.

Various compositions and microstructures may be formed in the sputtering process depending on the gas pressure and the bias voltage, as well as other processing parameters. However, it should be appreciated that upon appropriate control of the process parameters and coating alloy compositions, and as noted above, the coatings developed herein may be substantially amorphous in nature, wherein at least 50% or more of the coating may be amorphous, including all values and increments therein. In addition, the coatings may have a thickness of 0.1 to 500 microns (µm), including all values and increments therein. For example, the coatings may have a thickness of 0.1 to 250 µm, or 1.0 to 100 µm, or 10 to 50 µm, etc.

Figure 3:
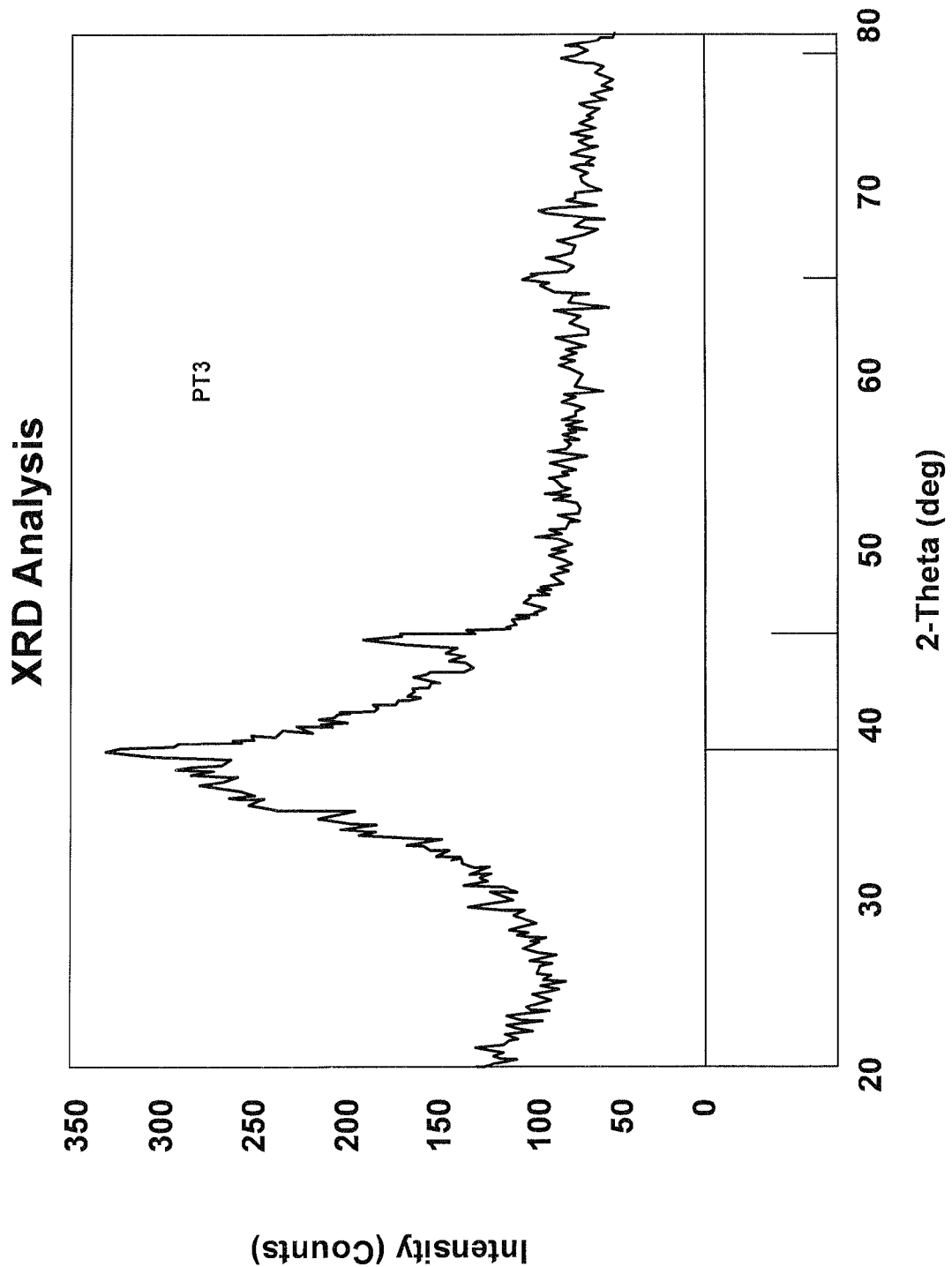
FIG. 3 is an exemplary XRD analysis of sample PT3 including an amorphous aluminum alloy coating.
Figure 4:
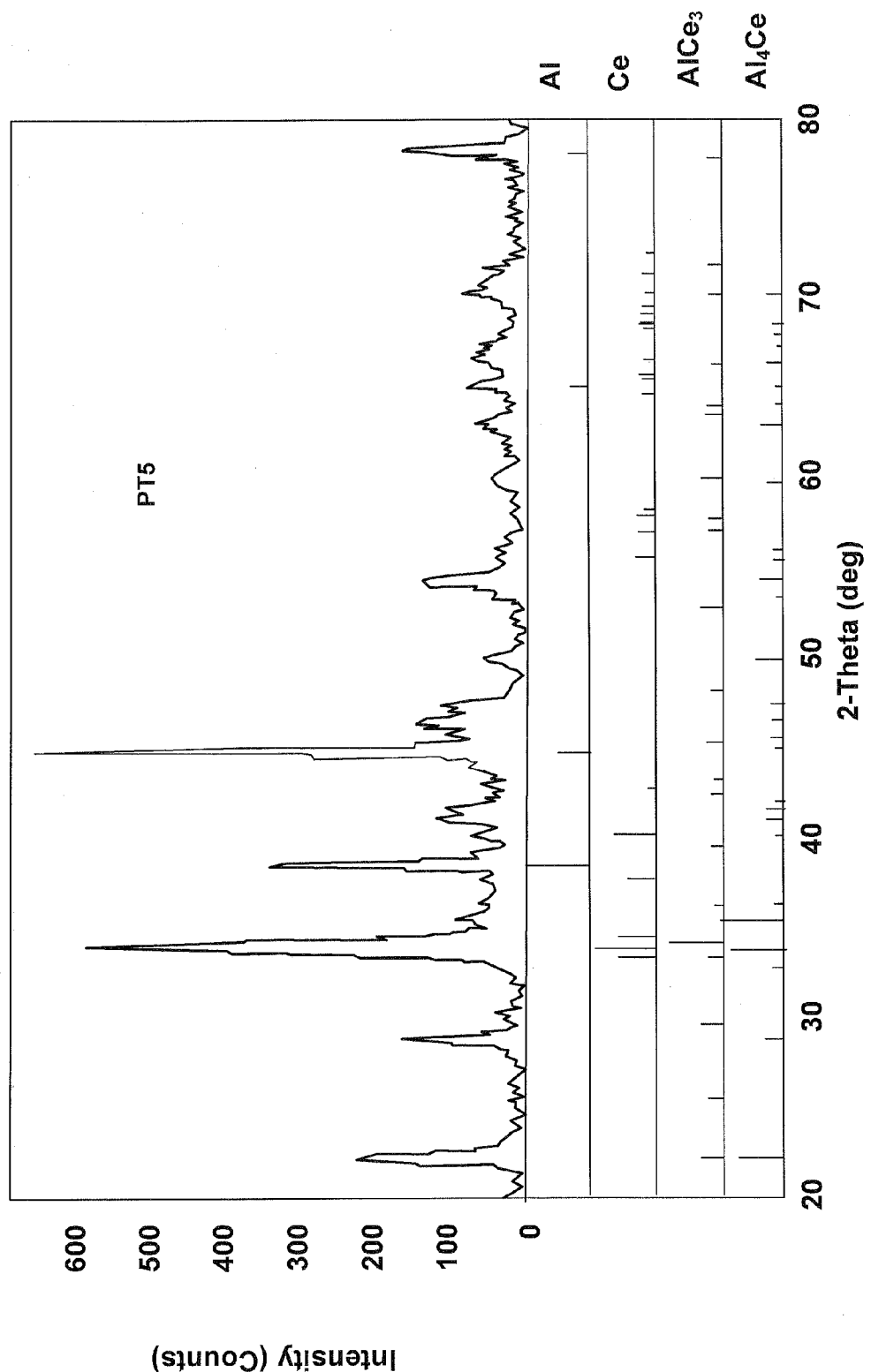
FIG. 4 is an exemplary XRD analysis of sample PT5 including a crystalline alloy coating.

The amorphous nature of the coating composition may be detected and understood by, for example, x-ray diffraction techniques, wherein the alloy composition may demonstrate an amorphous halo in the range of about 15° to 50° 2-Theta+/−5°, including all values and increments therein, as illustrated in FIG. 3. The amorphous halo may therefore be understood as a relatively broad peak over the indicated range without the relatively more discrete individual peaks observed in a crystalline sample. For example, a crystalline sample may exhibit more than one discrete peak in the range of 15° to 50° 2-Theta+/−5°, including all values and increments therein, such as peaks at about 22°, 29°, 34°, 39° and 44°, +/−5°, as illustrated in FIG. 4. In addition, a crystalline sample may exhibit additional peaks in the range of about 50° 2-Theta and greater, including all values and increments in the range of about 50° 2-Theta to 90° 2-Theta, such as peaks at about 54° and 78°, +/−5°. In addition, a crystalline composition may exhibit a number of phases, such as Al, Ce, AlCe$_3$ and/or Al$_4$Ce, illustrated at the bottom of FIG. 4.

The corrosion barrier properties of the coating developed may exhibit a relatively higher passive potential range, or $\Delta E_{passive}$, than crystalline aluminum alloy coatings or bare substrates. Passive potential range may be understood herein as the difference between the pitting potential $E_{pit}$ and the corrosion potential $E_{corr}$, wherein $\Delta E_{passive}=E_{pit}-E_{corr}$. Passive potential range may be determined by utilizing a cyclic polarization test setup. Cyclic polarization may include both anodic and cathodic polarization performed in a cyclic manner. Such test may be used to evaluate the susceptibility of a sample to pitting. Reference is therefore made to ASTM G61-86 (Reapproved 2003), Standard Test Method for Conducting Cyclic Potentiodynamic Polarization Measurements for Localized Corrosion Susceptibility of Iron-, Nickel-, or Cobalt-Based Alloys.

Figure 5:
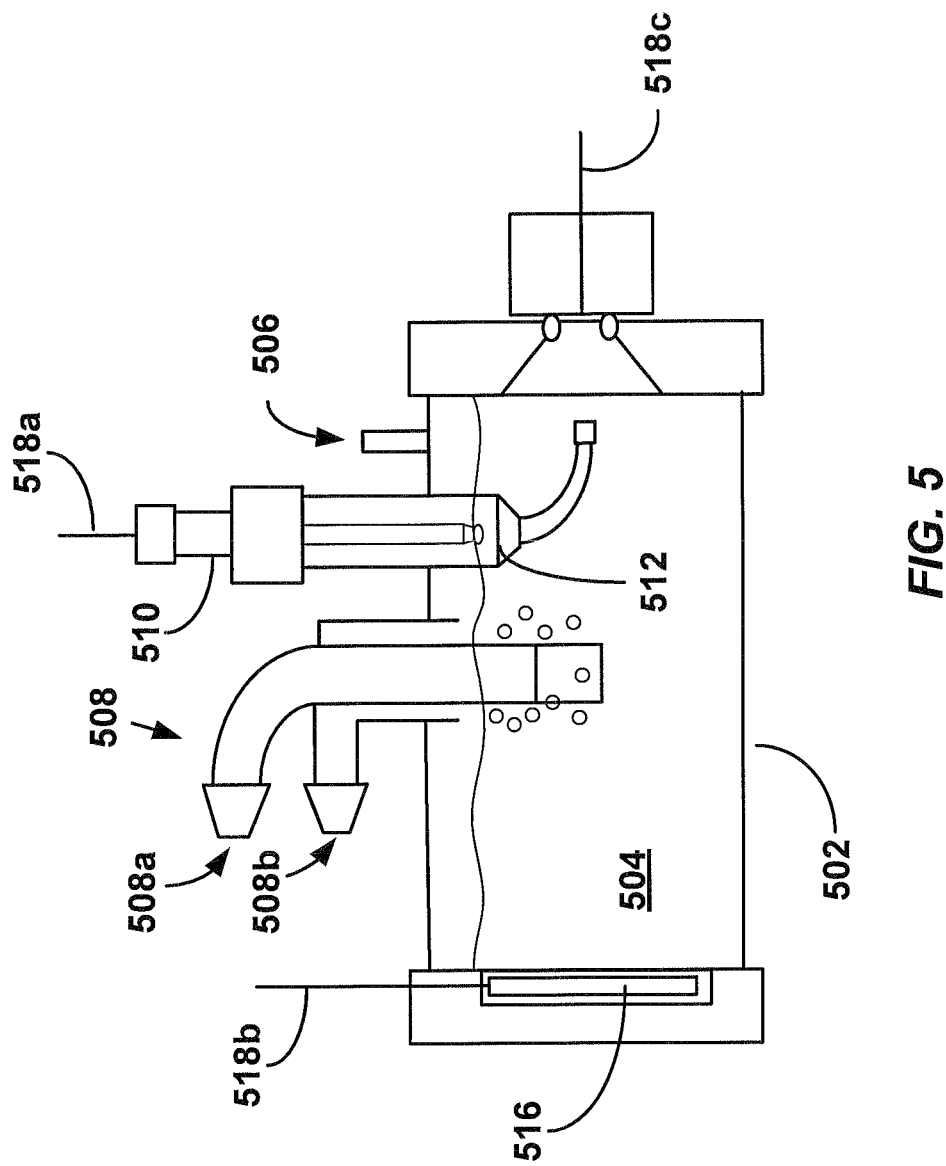
FIG. 5 is a schematic diagram of an example of a cyclic polarization testing setup.
Figure 6:
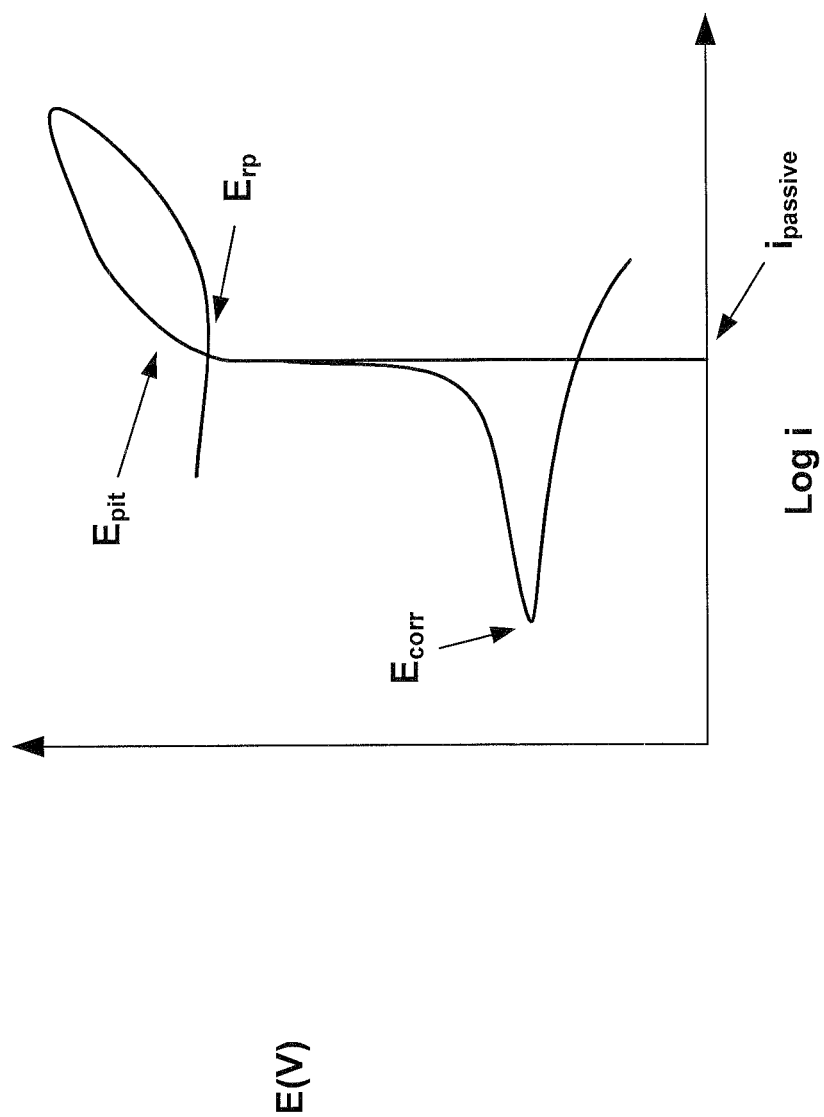
FIG. 6 is an illustration of an exemplary plot of corrosion potentials measured via cyclic polarization.

An exemplary test setup is schematically illustrated in FIG. 5. As can be seen in the figure, an electrochemical cell 502 may be provided including an electrolyte solution 504 supplied by a solution inlet 506. A nitrogen gas bubbler 508 may also be supplied having an inlet 508a and an outlet 508b. A reference electrode 510 may be placed in a Luggin probe or Luggin capillary 512. The Luggin probe is placed in close proximity to the test sample. A counter electrode 516 may also be included in the electrochemical cell 502. The reference and counter electrodes and the test sample may be in electrical communication with one or more potentiostats via electrical connections 518a, 518b, 518c. Such measurement may provide an indication of the corrosion, pitting and repassivation potentials as illustrated in FIG. 6.

Sample crystalline and amorphous coatings were applied to a number of substrates and formed as set forth in Tables 1 through 4 below. To form the exemplary alloys, an aluminum target was utilized and a number of Ce and Co tiles were arranged over the aluminum target. Table 1 illustrates for each sample, the substrates over which the coatings were made and the number of tiles used to make the coatings. Table 2 illustrates the sputter cleaning conditions for each sample. Table 3 illustrates the deposition conditions for each sample and Table 4 illustrates the morphology and composition of the resultant alloy compositions.

TABLE 1

Samples

| Sample No. | Substrates | Ce—Co Chips |
|---|---|---|
| PT1 | 1 pc 2024, 1 pc 7075, 1pc SS | None |
| PT2 | 1 pc 2024, 1 pc 7075, 1pc SS | Ce-3 tiles, Co-3 tiles |
| PT3 | 1 pc 2024, 1 pc 7075, 1pc SS | Ce-6 tiles, Co-6 tiles |
| PT4 | 1 pc 2024, 1 pc 7075, 1pc SS | Ce-2 tiles, Co-2 tiles |
| PT5 | 1 pc 2024, 1 pc 7075, 1pc SS | Ce-6 tiles, Co-6 tiles |
| PT6 | 1 pc 2024, 1 pc 7075, 1pc SS | Ce-6 tiles, Co-6 tiles |
| PT7 | 1 pc 2024, 1 pc 7075, 1pc SS | Ce-7 tiles, Co-7 tiles |
| PT8 | 1 pc 2024, 1 pc 7075, 1pc Ti | Ce-5 tiles, Co-5 tiles |
| PT9 | 1 pc 2024, 1 pc 7075, 1pc SS | Ce-3 tiles, Co-3 tiles |

In the table above, 2024 is Aluminum Alloy 2024-T3, 7075 is Aluminum Alloy 7075, SS is stainless steel and Ti is Titanium.

TABLE 2

Sputter Cleaning

| Sample No. | Temp (° C.) | Id(A) | Ib(A) |
|---|---|---|---|
| PT1 | 253 | 0.11 | 0.05 |
| PT2 | 259 | 0.14 | 0.09 |
| PT3 | 325 | 0.25 | 0.16 |
| PT4 | 334 | 0.27 | 0.27 |
| PT5 | 285 | 0.23 | 0.14 |
| PT6 | 284 | 0.24 | 0.13 |
| PT7 | 352 | 0.26 | 0.16 |
| PT8 | 310 | 0.26 | 0.15 |
| PT9 | 357 | 0.29 | 0.17 |

TABLE 3

Deposition

| Sample No. | Dep Time(min) | Temp (° C.) | If(V) | Vd(A) | Id(A) | Vb(V) | Ib(A) |
|---|---|---|---|---|---|---|---|
| PT1 | 120 | 266 | 0 | 0 | 0 | 120 | 0.05 |
| PT2 | 180 | 245 | 0 | 0 | 0 | 120 | 0.05 |
| PT3 | 240 | 168 | 0 | 0 | 0 | 120 | 0.04 |
| PT4 | 240 | 186 | 0 | 0 | 0 | 120 | 0.04 |
| PT5 | 240 | 267 | 8.6 | 120 | 0.24 | 40 | 0.05 |
| PT6 | 240 | 300 | 9.4 | 120 | 0.45 | 40 | 0.07 |
| PT7 | 240 | 175 | 0 | 0 | 0 | 120 | 0.04 |
| PT8 | 240 | 179 | 0 | 0 | 0 | 120 | 0.04 |
| PT9 | 240 | 152 | 0 | 0 | 0 | 120 | 0.04 |

TABLE 4

Analysis

| Sample No. | Thickness (μm) | Morphology | Al | Co | Ce | W |
|---|---|---|---|---|---|---|
| PT1 | 14.17 | Pure Al crystalline | 100.00 | 0.0 | 0.0 | |
| PT2 | — | Pure Al crystalline | 92.2 | 4.8 | 3.1 | |
| PT3 | 23.7 | Amorphous | 84.8 | 7.7 | 7.6 | |
| PT4 | 20.33 | Pure Al crystalline | 94.3 | 3.2 | 1.8 | |
| PT5 | 26.85 | Al/Al—Ce crystalline | 88.2 | 6.6 | 4.6 | |
| PT6 | — | Al/Al—Ce crystalline | 88.7 | 6.6 | 4.2 | 0.5 |
| PT7 | 23.86 | Amorphous | 84.7 | 8.5 | 6.8 | |
| PT8 | 21.87 | Al crystalline | 90.2 | 6.98 | 2.9 | |
| PT9 | 23.94 | Amorphous | 80.2 | 12.5 | 7.3 | |

The above samples were tested according to the cyclic polarization protocol discussed above. The samples were tested in included 0.6 M sodium chloride solution that was de-aerated. The results of these tests are presented in Table 5 below.

TABLE 5

Cyclic Polarization Results

| Sample No. | Crystal Structure | Ecorr (Vsce) | Epit (Vsce) | Erepass (Vsce) | ΔEpassive (V) |
|---|---|---|---|---|---|
| PT1 bare 2024-T3 | crystalline | −0.679 | −0.600 | <−0.780 | 0.079 |
| PT1 bare 7075-T6 | crystalline | −0.861 | −0.700 | −0.734 | 0.161 |
| Alclad AA7075-T6 | crystalline | −0.988 | −0.794 | −0.885 | 0.194 |

TABLE 5-continued

Cyclic Polarization Results

| Sample No. | Crystal Structure | Ecorr (Vsce) | Epit (Vsce) | Erepass (Vsce) | ΔEpassive (V) |
|---|---|---|---|---|---|
| PT5 on 2024 | crystalline | −0.688 | −0.646 | −0.700 | 0.042 |
| PT3 on 2024 | amorphous | −0.776 | −0.368 | −0.383 | 0.408 |
| PT7 on 2024 | amorphous | −0.826 | −0.310 | −0.839 | 0.533 |
| PT7 on 7075 | amorphous | −0.843 | −0.697 | −0.830 | 0.146 |
| PT9 on 2024 | amorphous | −0.7796 | −0.293 | −0.764 | 0.483 |
| PT9 on 7075 | amorphous | −0.822 | −0.334 | −0.758 | 0.488 |

Figure 7:
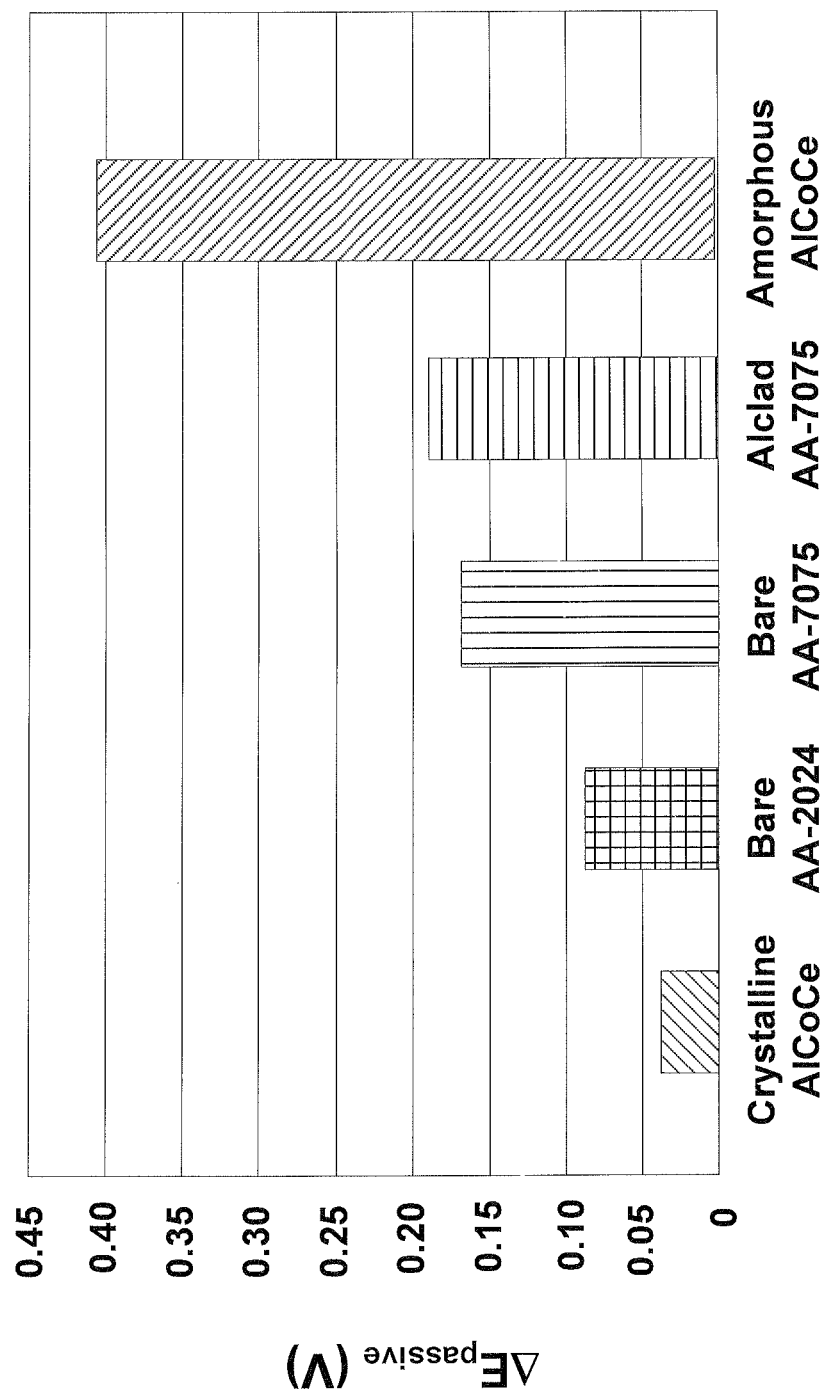
FIG. 7 is a plot of the corrosion resistance of an exemplary crystalline AlCoCe alloy (sample PT5 on 2024), Bare AA-2024 alloy, Bare AA-7075 alloy, Alclad AA-7075 alloy and amorphous AlCoCe alloy (sample PT3 on 2024).

As seen in the above table, the amorphous coatings identified generally exhibited a ΔEpassive of greater than 0.400 Vsce, demonstrating that the amorphous aluminum alloy coatings exhibited greater resistance to corrosion. A portion of these results are also summarized in FIG. 7, which is a plot of the corrosion resistance of an exemplary crystalline AlCoCe alloy (sample PT5 on 2024), Bare AA-2024 alloy (sample PT1 bare 2024-T3), Bare AA-7075 alloy (sample PT1 bare 7075-T6), Alclad AA-7075 alloy (sample Alclad AA7075-T6) and amorphous AlCoCe alloy (sample PT3 on 2024). Accordingly, it is contemplated herein that the amorphous aluminum alloy coatings herein having an amorphous content of 50% or higher may have a ΔEpassive of greater than 0.250 Vsce.

The foregoing description of several methods and an embodiment of the invention have been presented for purposes of illustration. It is not intended to be exhaustive or to limit the invention to the precise steps and/or forms disclosed, and obviously many modifications and variations are possible in light of the above teaching. It is intended that the scope of the invention be defined by the claims appended hereto.

What is claimed is:

1. A method of forming an amorphous aluminum alloy coating comprising:
    providing a vacuum chamber;
    providing a substrate for coating, wherein said substrate is an aluminum alloy comprising aluminum present at levels in the range of 75 atomic percent to 99 atomic percent and one or more of the following elements: Cu, Cr, Fe, Mg, Mn, Si, Ti, and Zn, present in the range of 1 atomic percent to 25 atomic percent, and said alloy exhibits a density in the range of 2.75 grams per cubic centimeter to 3.0 grams per cubic centimeter and a coefficient of thermal expansion in the range of 24 μm/m−° C. to 30 μm/m−° C.;
    providing a target material comprising aluminum and one or more alloying elements;
    providing an inert process gas;
    applying a bias voltage to said substrate;
    applying 1 to 10 kW of power at a negative bias to said target and forming plasma with said inert process gas;
    ejecting particles from said target and depositing an amorphous aluminum alloy coating wherein at least 50% of said alloy is amorphous and includes nanocrystalline domains of 100 nanometers or less as deposited, and said amorphous aluminum alloy coating consists of aluminum present in the range of 75 to 85 atomic percent, cerium present in the range of 5 to 15 atomic percent and cobalt present in the range of 5 to 15 atomic percent, wherein said coating indicates a ΔEpassive of greater than 0.250 Vsce.

2. The method of claim 1 wherein said particles are ejected from said target by a magnetron sputter deposition apparatus including a cooling system.

3. The method of claim 1 including sputter cleaning of said substrate.

4. The method of claim 1 wherein said amorphous aluminum alloy indicates an x-ray diffraction amorphous halo in the range of 15° to 50° 2-Theta.

5. The method of claim 1 wherein said coating has a thickness of 0.1-500 microns.

6. A method of forming an amorphous aluminum alloy coating comprising:
    providing a vacuum chamber;
    providing a substrate for coating, wherein said substrate is an aluminum alloy comprising aluminum present at levels in the range of 75 atomic percent to 99 atomic percent and one or more of the following elements: Cu, Cr, Fe, Mg, Mn, Si, Ti, and Zn, present in the range of 1 atomic percent to 25 atomic percent, and said alloy exhibits a density in the range of 2.75 grams per cubic centimeter to 3.0 grams per cubic centimeter and a coefficient of thermal expansion in the range of 24 μm/m−° C. to 30 μm/m−° C.;
    providing a target material comprising aluminum, Ce and Co as alloying elements, wherein said Ce and Co are provided in equal amounts;
    ejecting particles from said target and depositing an amorphous aluminum alloy coating wherein at least 50% of said alloy is amorphous and includes nanocrystalline domains of 100 nanometers or less as deposited, said amorphous aluminum alloy coating consists of aluminum present in the range of 75 to 85 atomic percent, cerium present in the range of 5 to 15 atomic percent and cobalt present in the range of 5 to 15 atomic percent, wherein said Ce and Co are present in said aluminum alloy coating at different concentrations, and said coating has a thickness of 0.1-500 μm and wherein said coating indicates a ΔEpassive of greater than 0.250 Vsce.

7. The method of claim 6 wherein said particles are ejected from said target by a magnetron sputter deposition apparatus including a cooling system and a magnet assembly wherein said magnetron assembly is configured to provide a negative bias in the presence of a gas plasma and drawing ions from said plasma to said target material resulting in ion sputtering and ejection of said particles from said target.

8. The method of claim 6 including sputter cleaning of said substrate.

9. The method of claim 6 wherein said amorphous aluminum alloy indicates an x-ray diffraction amorphous halo in the range of 15° to 50° 2-Theta.

* * * * *